(12) United States Patent
Yokoyama

(10) Patent No.: US 6,245,665 B1
(45) Date of Patent: Jun. 12, 2001

(54) SEMICONDUCTOR DEVICE AND METHOD OF FABRICATING THE SAME

(75) Inventor: Takashi Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/458,243

(22) Filed: Dec. 9, 1999

(30) Foreign Application Priority Data

Dec. 9, 1998 (JP) .................................................. 10-349888

(51) Int. Cl.[7] .............................................. H01L 21/4763
(52) U.S. Cl. ....................... 438/623; 438/637; 438/638; 438/624; 438/687
(58) Field of Search ...................................... 438/623, 631, 438/637, 638, 622, 624, 687

(56) References Cited

U.S. PATENT DOCUMENTS

| 6,051,508 | * | 4/2000 | Takase et al. | 438/724 |
| 6,054,379 | * | 4/2000 | Yau et al. | 438/623 |
| 6,159,845 | * | 12/2000 | Yew et al. | 438/637 |

FOREIGN PATENT DOCUMENTS

| 0826791 | * | 3/1998 | (EP) . |
| 10-112503 | | 4/1998 | (JP) . |
| 10-150105 | | 6/1998 | (JP) . |

* cited by examiner

*Primary Examiner*—Trung Dang
(74) *Attorney, Agent, or Firm*—Hutchins, Wheeler & Dittmar

(57) ABSTRACT

A semiconductor device equipped with the dual damascene structure that is provided, which suppresses the propagation delay of signals effectively without using any complicated processes. The device is comprised of (i) a semiconductor substrate having a lower wiring layer and electronic elements; (ii) a first interlayer dielectric layer formed on the substrate; (iii) a second interlayer dielectric layer formed on the first interlayer dielectric layer, the second interlayer dielectric layer being made of carbon-containing $SiO_2$; (iv) a third interlayer dielectric layer formed on the second interlayer dielectric layer; (v) a fourth interlayer dielectric layer formed on the third interlayer dielectric layer, the fourth interlayer dielectric layer being made of carbon-containing $SiO_2$; (vi) the first and second interlayer dielectric layers having a via hole penetrating therethrough; (vii) the third interlayer dielectric layer having a recess overlapping with the via hole, the recess being formed to communicate with the via hole; (viii) a metal plug formed in the via hole to be contacted with the lower wiring layer or the electronic elements in the substrate; (ix) a metal wiring layer formed in the recess; and (x) a fourth interlayer dielectric layer formed on the third interlayer dielectric layer to cover the metal wiring layer.

8 Claims, 4 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same and more particularly, to a semiconductor device with the dual damascene structure in which the wire-to-wire capacitance is reduced and the propagation delay of signals is suppressed, and a method of fabricating the device without using any complicated process steps.

2. Description of the Prior Art

In recent years, there has been the increasing need to raise the speed of signal processing in semiconductor devices, especially in Large-Scale Integrated circuits (LSIs). The signal processing speed in LSIs is mainly dependent upon the operation speed of individual transistors and the delay of signals propagating through wiring lines.

Conventionally, the operation speed of transistors has bean gradually raised according to their consecutive dimensional reduction However, in LSIs fabricated under the design rule of 0.18 µm or less, it has been found that the signal processing speed is affected more by the propagation delay of signals in wiring lines than by the operation speed of transistors.

To reduce the propagation delay of signals, vigorous development has been made to intend the use of copper (Cu) instead of aluminum (Al), because Cu is lower in electric resistance than Al. Since Cu is lower in vapor pressure than that of halides, it is difficult to be processed or patterned by ordinary dry etching processes at low temperatures. Thus, it is usual that wiring recesses are formed in a silicon dioxide ($SiO_2$) layer and then, Cu is deposited on the $SiO_2$ layer to fill the recesses with Cu, thereby forming wiring lines made of Cu in the recess. These Cu wiring lines constitute a Cu wiring layer.

The wiring structure thus formed is termed the "damascene structure". If the Cu wiring lines are simply formed in the recesses, the process is termed the "single damascene process". If the Cu wiring lines are formed in the recesses and at the same time, via holes for interconnecting the Cu wiring layer with an underlying wiring layer or underlying electronic elements are formed, the process is termed the "dual damascene process". Considering the fabrication coat of LSIs, the dual damascene process is preferred to the single one.

FIGS. 1A to 1D show an example of the prior-art methods of fabricating an LSI using the dual damascene process.

First, as shown in FIG. 1A, a $SiO_2$ layer 302 is formed on the surface of a single-crystal silicon substrate 301 as a first interlayer dielectric layer. Although the substrate 301 has specific electronic elements such as transistors and at least one wiring layer connected thereto, only a diffusion region 301a of one of the elements is illustrated in FIG. 1A for the sake of simplification.

A silicon nitride ($SiN_x$) layer 303 is then formed on the $SiO_2$ layer 302 serving as the first interlayer dielectric layer. The $SiN_x$ layer 303 serves as a second interlayer dielectric layer. The $SiN_x$ layer 303 is patterned by using a patterned photoresist film (not shown) to form an opening 303a exposing the surface of the underlying $SiO_2$ layer 302. The opening 303a is located to overlap with the underlying diffusion region 301a of the substrate 301. The opening 303a forms an upper part of a desired via hole to be formed in the subsequent process steps.

Although any other openings are formed in the layer 303, only one of them is shown here for simplicity. The state at this stage is shown in FIG. 1A.

Subsequently, as shown in FIG. 1B, a $SiO_2$ layer 304 is formed on the $SiN_x$ layer 303 to cover the whole substrate 1 as a third interlayer dielectric layer. The opening 303a is filled with the layer 303. Then, a patterned photoresist film 305 is formed on the $SiO_2$ layer 304. The photoresist film 305 has a pattern corresponding to that of a desired wiring layer. Only a window 305a of the film 305 is shown in FIG. 1B for simplicity.

Using the patterned photoresist film 305 as a mask, the $SiO_2$ layer 304 is selectively etched by an ordinary dry etching process to form a wiring recess 311 in the layer 304, as shown in FIG. 1C. The recess 311 extends on the $SiN_x$ layer 303 from back to forth in a direction perpendicular to the paper. During the same etching process, the underlying $SiO_2$ layer 302 is selectively etched while the $SiN_x$ layer 303 with the opening 303a is used as a mask, thereby forming an opening 302a in the layer 302. The openings 302a and 303a, which are overlapped with each other and communicate therewith, constitute a via hole 312 interconnecting the recess 311 with the diffusion region 301a of the substrate 301. Thereafter, the photoresist film 305 is removed. The state at this stage is shown in FIG. 1C.

During the above-described etching process, the $SiN_x$ layer 303 serves as an etch stop layer for the $SiO_2$ layer 302 and a masking layer therefor Therefore, the $SiO_2$ layer 302 can be selectively etched as explained above, resulting in the dual damascene structure, as shown in FIG. 1C.

A barrier layer 306, which is made of a metal such as tantalum (Ta) and titanium nitride (TiN), is formed to cover the exposed surfaces of the recess 311 and the via hole 312 and the diffusion region 301a, as shown in FIG. 1D.

A Cu plug 307 is then formed on the barrier layer 306 in the via hole 312, and a Cu wiring layer 308 is formed on the barrier layer 306 in the recess 311 so as to be contacted with the plug 307, as shown in FIG. 1D. The Cu plug 307 and the CU wiring layer 308 are formed by depositing a Cu layer to cover the entire $SiO_2$ layer 304 using a plating, sputtering, or Chemical Vapor Deposition (CVD) process, and by selectively removing the Cu layer thus deposited by a Chemical Mechanical Polishing (CMP) process.

Finally, a $SiN_x$ layer 309 is formed on the $SiO_2$ layer 304 to cover the Cu wiring layer 308. The layer 309 serves as a fourth interlayer dielectric layer and a diffusion prevention layer of Cu existing in the wiring layer 308.

However, the prior-art method shown in FIGS. 1A to 1D has the following problem:

Since the $SiN_x$ layer 303, which has a relative dielectric constant as high as approximately 7 to 8, is used as an etch stop layer during the etching process of the $SiO_2$ layers 304 and 302, the wire-to-wire capacitance becomes extremely higher than the case where the $SiN_x$ layer 303 is replaced with a $SiO_2$ layer due to the fringing field effect. This increases largely the propagation delay of signals.

The same problem as above will occur if the $SiN_x$ layer 303 is replaced with a silicon oxynitride (SiON) layer having a relative dielectric constant of approximately 5 to 6.

To solve the above-described problem, improved methods have been developed, in which an organic dielectric layer is used as an interlayer dielectric layer rather than a $SiN_x$ layer. The organic dielectric layer is made of, for example, a polytetrafluoroethylene (PTFE), a fluorinated polyallyl ether, or a fluorinated polyimide. These improved methods are disclosed in the Japanese Non-Examined Patent Publication Nos. 10-112503 published in April 1998 and 10-150105 published in June 1998.

With the improved methods using the above-described organic dielectric layer, the above-described problem that the propagation delay of signals is increased can be solved, because the organic dielectric layers are considerably lower in relative dielectric constant than $SiO_2$. However, these methods have other problems explained below.

Since the organic dielectric layers disclosed in the Japanese Non-Examined Patent Publication Nos. 10-112503 and 10-150105 have a low heat- and plasma-resistant property, they tend to be changed in quality in the fabrication process sequence of LSIs (especially, in the dry etching process), resulting in increase of the relative dielectric constant. In other words, low relative dielectric constants of there layers are difficult to be realized as desired. Consequently, they cause a problem that the propagation delay of signals cannot be suppressed effectively.

Moreover, the organic dielectric layers necessitate complicated process steps of removing resist films used for patterning the same organic dielectric layers. This means that they cause another problem that the fabrication cost of LSIs becomes higher.

SUMMARY OF THE INVENTION

Accordingly, an object of the present invention is to provide a semiconductor device equipped with the dual damascene structure that suppresses the propagation delay of signals effectively, and a method of fabricating the device.

Another object of the present invention is to provide a semiconductor device equipped with the dual damascene structure that is fabricated without using any complicated processes, and a method of fabricating the device.

Still another object of the present invention is to provide a semiconductor device equipped with the dual damascene structure that prevents the fabrication cost increase, and a method of fabricating the device.

The above objects together with others not specifically mentioned will become clear to those skilled in the art from the following description.

According to a first aspect of the present invention, a semiconductor device equipped with the dual damascene structure is provided, which is comprised of (i) a semiconductor substrate having a lower wiring layer and electronic elements; (ii) a first interlayer dielectric layer formed on the substrate; (iii) a second interlayer dielectric layer formed on the first interlayer dielectric layer, the second interlayer dielectric layer being made of a carbon-containing $SiO_2$; (iv) a third interlayer dielectric layer formed on the second interlayer dielectric layer; (v) a fourth interlayer dielectric layer formed on the third interlayer dielectric layer, the fourth interlayer dielectric layer being made of a carbon-containing $SiO_2$; (vi) the first and second interlayer dielectric layers having a via hole penetrating therethrough, the via hole exposing the substrate; (vii) the third interlayer dielectric layer having a recess overlapping with the via hole, the recess being formed to communicate with the via hole; (viii) a metal plug formed in the via hole to be contacted with the lower wiring layer or the electronic elements in the substrate; (ix) a metal wiring layer formed in the recess; and (x) a fourth interlayer dielectric layer formed on the third interlayer dielectric layer to cover the metal wiring layer.

With the semiconductor device according to the first aspect of the present invention, each of the second and forth interlayer dielectric layers is made of carbon-containing $SiO_2$ that is lower in relative dielectric constant than $SiN_x$. Therefore, the wire-to-wire capacitance is reduced compared with the case where a $SiN_x$ layer is used instead of the carbon-containing $SiO_2$ layer. Thus, the propagation delay of signals can be suppressed effectively.

Also, the use of the carbon-containing $SiO_2$ layers does not make the fabrication process steps complicated and therefore, the dual damascene structure can be fabricated without using any complicated processes and the fabrication cost increase can be prevented.

According to a second aspect of the present invention, a method of fabricating the semiconductor device according to the first aspect of the present invention is provided, which is comprised of the following steps of (a) to (i).

In the step (a), a semiconductor substrate having a lower wiring layer and electronic elements is prepared.

In the step (b), a first interlayer dielectric layer is formed on the substrate.

In the step (c), a second interlayer dielectric layer is formed on the first interlayer dielectric layer. The second interlayer dielectric layer is made of a carbon-containing $SiO_2$.

In the step (d), an opening is formed in the second interlayer dielectric layer to overlap with the lower wiring layer or the electronic elements.

In the step (e), a third interlayer dielectric layer is formed on the second interlayer dielectric layer having the opening.

In the step (f), a patterned mask layer having a window is formed on the third interlayer dielectric layer. The window is located to overlap with the opening of the second interlayer dielectric layer.

In the step (g), the third interlayer dielectric layer is patterned to form a wiring recess in the third interlayer dielectric layer using the patterned mask layer while the first interlayer dielectric layer is patterned to form a via hole in the first interlayer dielectric layer using the second interlayer dielectric layer. The via hole communicates with the wiring recess.

In the step (h), a conductive layer is selectively formed to fill the wiring recess and the via hole after removing the patterned mask layer, thereby forming a wiring layer in the recess and a conductive plug in the hole. The wiring layer is contacted with the conductive plug.

In the step (i), a fourth interlayer dielectric layer is formed on the third interlayer dielectric layer to cover the wiring layer. The fourth interlayer dielectric layer is made of a carbon-containing $SiO_2$.

With the method according to the second aspect of the present invention, the second interlayer dielectric layer, which is made of carbon-containing $SiO_2$ that is lower in relative dielectric constant than $SiN_x$, is formed on the first interlayer dielectric layer in the step (c).

Also, in the step (g), the third interlayer dielectric layer is patterned to form the wiring recess in the third interlayer dielectric layer using the patterned mask layer while the first interlayer dielectric layer is patterned to form the via hole communicating with the recess in the first interlayer dielectric layer using the second interlayer dielectric layer.

In the step (h), the wiring layer is farmed in the recess and the conductive plug contacting with the wiring layer is formed in the hole. Furthermore, the forth interlayer dielectric layer, which is made of carbon-containing $SiO_2$, is formed on the third interlayer dielectric layer in the step (i).

Therefore, the semiconductor device according to the first aspect of the present invention is fabricated.

According to a third aspect of the present invention, another method of fabricating the semiconductor device according to the first aspect of the present invention is provided, which is comprised of the following steps (a') to (i').

In the step (a'), a semiconductor substrate having a lower wiring layer and electronic elements is prepared.

In the step (b'), a first interlayer dielectric layer is formed on the substrate.

In the step (c'), a second interlayer dielectric layer is formed on the first interlayer dielectric layer. The second interlayer dielectric layer is made of a carbon-containing $SiO_2$.

In the step (d'), a third interlayer dielectric layer is formed on the second interlayer dielectric layer In the step (e'), the third interlayer dielectric layer is patterned to form a wiring recess therein to overlap with the lower wiring layer or the electronic elements.

In the step (f'), a patterned mask layer having a window As formed on the third interlayer dielectric layer. The window is located to overlap with the wiring recess of the third interlayer dielectric layer.

In the step (g'), the first and second interlayer dielectric layers are patterned to form a via hole penetrating the first and second interlayer dielectric layers using the patterned mask layer. The via hole communicates with the wiring recess.

In the step (h'), a conductive layer is selectively formed to fill the wiring recess and the via hole after removing the patterned mask layer, thereby forming a wiring layer in the recess and a conductive plug in the hole. The wiring layer is contacted with the conductive plug.

In the step (i'), a fourth interlayer dielectric layer is formed on the third interlayer dielectric layer to cover the wiring layer. The fourth interlayer dielectric layer is made of a carbon-containing $SiO_2$.

With the method according to the third aspect of the present invention, in the stop (e') of patterning the third interlayer dielectric layer, the underlying second interlayer dielectric layer made of a carbon-containing $SiO_2$ serves as an etch stop layer. Therefore, the wiring recess can be formed in the third interlayer dielectric layer as desired.

Also, since each of the second and fourth interlayer dielectric layers is made of a carbon-containing $SiO_2$, the semiconductor device according to the first aspect of the present invention is fabricated.

In a preferred embodiment of the present invention, the carbon-containing $SiO_2$ contains a hydrocarbon (CH) group, and each of the second and fourth interlayer dielectric layers has a relative dielectric constant of approximately 5 or lower. If the relative dielectric constant is greater than approximately 5, the possibility that the wire-to-wire capacitance is unable to be suppressed becomes high.

In another preferred embodiment of the present invention, the carbon-containing $SiO_2$ contains a Si-H group. The carbon-containing $SiO_2$ has Si-C bonds. In addition to the Si-C bonds, it may contain Si-H groups or bonds. In this case, there are the same advantages as described above. The containing of Si-H groups produces an additional advantage that the relative dielectric constant becomes lower (the plasma-resistance property may degrade).

In still another preferred embodiment of the present invention, each of the first and third interlayer dielectric layers is made of a substance selected from the group consisting of plasma-deposited $SiO_2$, fluorinated, plasma-deposited $SiO_2$ (SiOF), and hydrogen silsesquixan (HSQ). In this embodiment, the advantages of the invention can be exhibited conspicuously.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
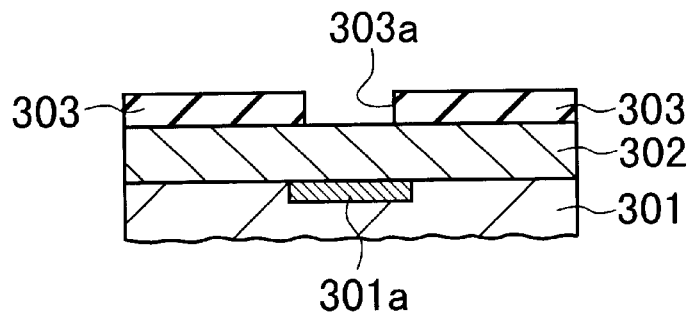
FIGS. 1A to 1D are partial, cross-sectional views of a semiconductor device showing the process steps of a prior-art method of fabricating the same, respectively.
Figure 1B:
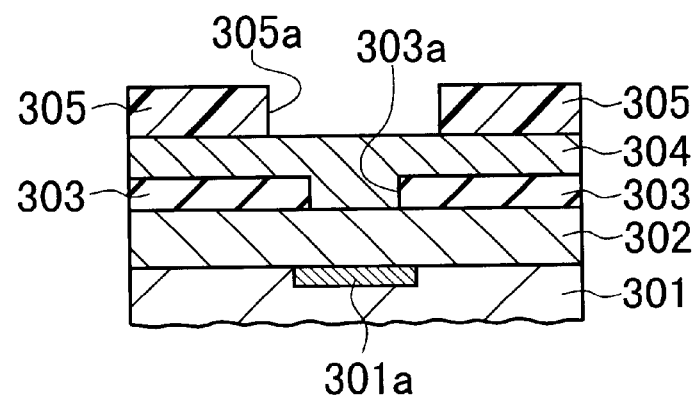
Figure 1C:
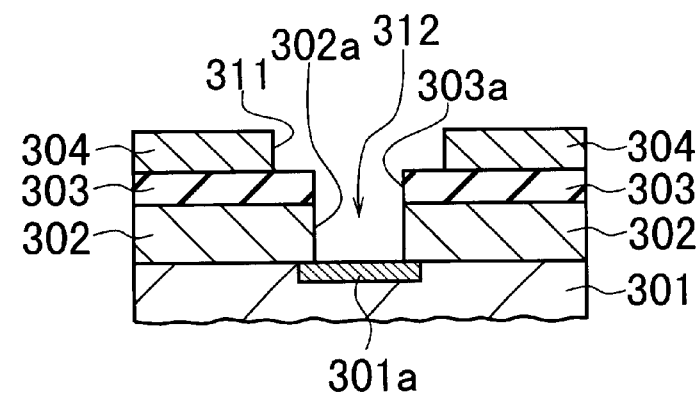
Figure 1D:
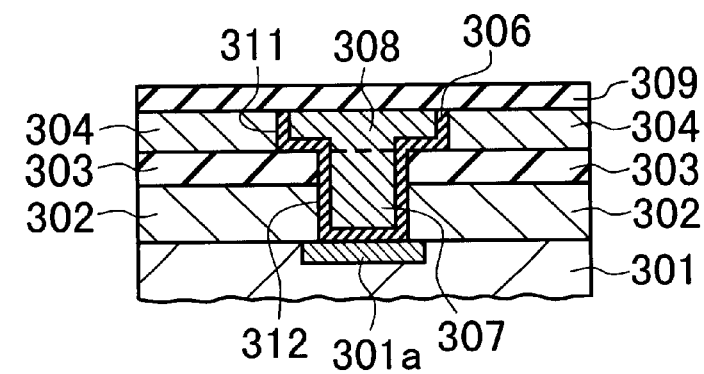

Preferred embodiments of the present invention will be described in detail below while referring to the drawings attached.

FIRST EMBODIMENT

FIGS. 2A to 2G show a method of fabricating a semiconductor device according to a first embodiment, which uses the dual damascene process.

Figure 2A:
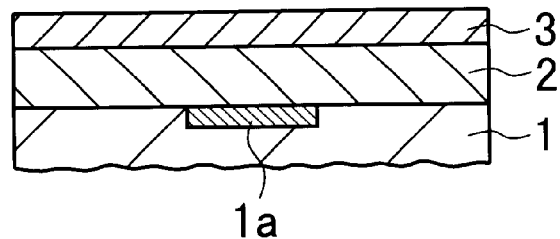
FIGS. 2A to 2G are partial, cross-sectional views of a semiconductor device showing the process steps of a method of fabricating the same according to a first embodiment of the present invention, respectively.

First, as shown in FIG. 2A, a single-crystal silicon substrate 1 having specific electronic elements such as transistors and am least one wiring layer is prepared. Only a diffusion region 1a of one of the elements is illustrated in FIG. 2A for the sake of simplification.

Then, a first interlayer dielectric layer 2 with a thickness of 100 to 800 nm is formed on the surface of the substrate 1 by a plasma-enhanced CVD process. The layer 2 is made of plasma-deposited $SiO_2$, fluorinated plasma-deposited $SiO_2$ (i.e., SiOF), or HSQ.

Next, a second interlayer dielectric layer 3 with a thickness of 50 to 400 nm is formed on the first interlayer dielectric layer 2. The layer 3 is made of $SiO_2$ containing carbon of 5 to 30 weight % (wt. %). If the carbon content is greater than 30 wt. %, the layer 3 will have similar property to that of the organic dielectric layers, resulting in deterioration in the adhesion strength to a $SiO_2$ layer and the plasma-resistant property to oxygen plasma that is often used in the process of removing a resist mask. On the other hand, if the carbon content is less than 5 wt. %, the layer 3 will not have the property as intended in the present invention.

The second interlayer dielectric layer 3 is formed by coating a silica-based coating material containing methyl groups ($CH_3$—), ethyl groups ($CH_3CH_2$—), or phenyl groups ($C_6H_5$—). However, it may be formed by a CVD method using a gaseous mixture of silane or tetraethoxyorthosilicate (TEOS) and methane, benzene, xylene, di-paraxylene, or the like. Alternately, it may be formed by a CVD method using mono-, di-, tri-, or tetra-methylsilane, or mono-, di-, tri-, or tetra-ethylsilane. The layer 3 may contain the silicon-hydrogen (Si-H) bond.

Figure 2B:
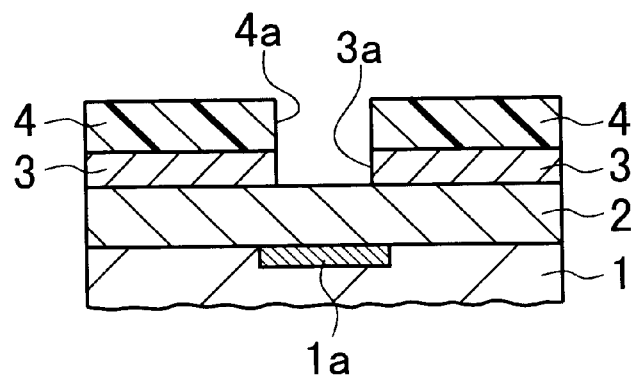

Next, as shown in FIG. 2B, a patterned photoresist film 4 is formed on the second interlayer dielectric layer 3. Although the film 4 has a pattern corresponding to a desired wiring recess, only one window 4a of the pattern of the film 4 is shown for simplicity. Using the patterned photoresist film 4 as a mask, the second interlayer dielectric layer 3 is selectively etched by an ordinary dry etching process, thereby forming an opening 3a in the layer 3. The state at this stage is shown in FIG. 2B.

The second interlayer dielectric layer 3 thus etched serves as a mask in a subsequent step of forming a via hole in the first interlayer dielectric layer 2.

Figure 2C:
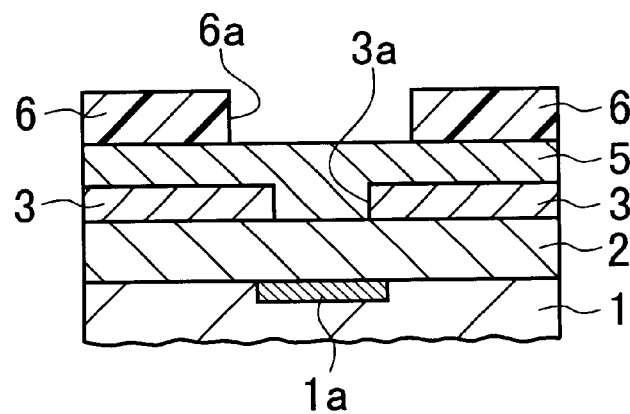

After the photoresist film 4 is removed, a third interlayer dielectric layer 5 with a thickness of 200 to 800 nm is formed on the patterned second interlayer dielectric layer 3 in the same way as that of the first interlayer dielectric layer 102, as shown in FIG. 2C. The layer 3 is made of plasma-deposited $SiO_2$, fluorinated, plasma-deposited $SiO_2$, or HSQ.

A photoresist film 6 is formed on the third interlayer dielectric layer 5 over the whole substrate 1. The film 6 thus formed is patterned to have a desired pattern of the wiring recess Here, a window 6a of the patterned photoresist film 6 is shown in FIG. 2C for simplicity.

Figure 2D:
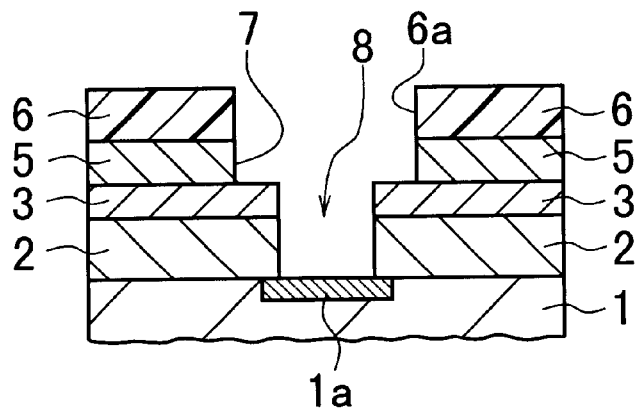

Subsequently, using the patterned photoresist film 6 as a mask, the third interlayer dielectric layer 5 is selectively etched by a dry etching process using a suitable fluorine-containing gas as an etchant. As the fluorine-containing gas, for example, $CF_4$, $C_4F_8$, or $C_2F_6$ may be used. During this dry etching process, the first interlayer dielectric layer 2 is selectively etched using the patterned second interlayer dielectric layer 3 as a mask. Thus, as shown in FIG. 2D, a wiring recess 7 is formed in the third interlayer dielectric layer 5 and a via hole 8 is formed in the first interlayer dielectric layer 2. The recess 7 overlaps with the underlying hole 8 and communicates therewith.

If $Cf_4$ is used as the etching gas, the chemical reaction between this gas and $SiO_2$ is schematically expressed by the following equation (1), and the chemical reaction between this gas and carbon-containing $SiO_2$ is by the following equation (2).

$$CF_4 + SiO_2 \rightarrow SiF_4 + CO_2 \quad (1)$$

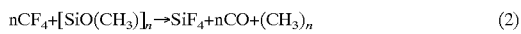

$$nCF_4 + [SiO(CH_3)]_n \rightarrow SiF_4 + nCO + (CH_3)_n \quad (2)$$

As seen from the equation (2), as the carbon content of the carbon-containing $SiO_2$ layer increases, the etch rate decreases gradually due to deposition of the hydrocarbon polymer. Therefore, the etch rate difference of the carbon-containing $SiO_2$ from carbonless $SiO_2$ becomes conspicuously large. Because of this etch rate difference, the second interlayer dielectric layer 3 made of carbon-containing $SiO_2$ serves effectively as an etch stop layer during the dry etching process for the third and first interlayer dielectric layers 5 and 2 both made of carbonless $SiO_2$.

Following the dry etching process, the photoresist film 6 is removed prom the third interlayer dielectric layer 5 by using ionic oxygen plasma with strong anisotropy. Because of the use of ionic plasma, the photoresist film 6 can be removed without deterioration of the underlying second interlayer dielectric layer 3 made of carbon-containing $SiO_2$.

If an organic dielectric layer disclosed in the prior-art methods is used as the second interlayer dielectric layer 3, it tends to change in quality and to deteriorate.

Figure 2E:
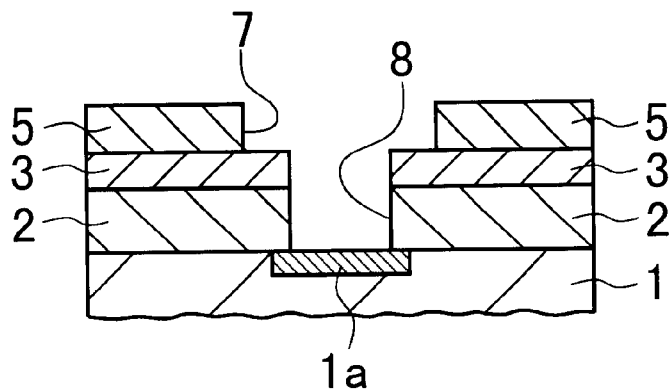

Throughout the above-described process steps, the dual damascene structure is formed, as shown in FIG. 2E. In this structure, the via hole 8 penetrating vertically the first and second interlayer dielectric layers 2 and 3 is located to overlap with the diffusion region la of the substrate 1 and at the same time, the wiring recess 7 penetrating vertically the third interlayer dielectric layer 5 is located to overlap with the via hole 8.

Figure 2F:
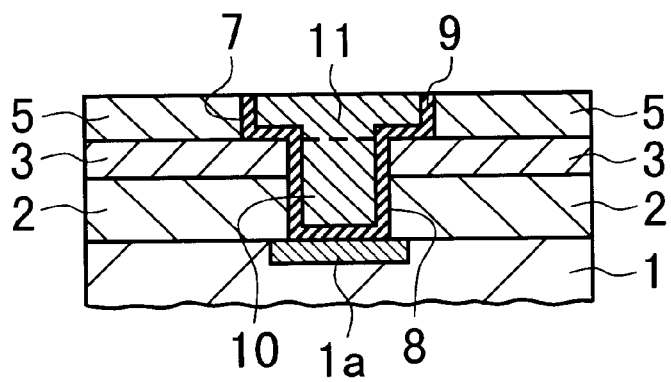

Thereafter, as shown in FIG. 2F, a metal barrier layer 9 with a thickness of 5 to 100 nm, which is made of TiN, Ta, or TaN, is formed on the third interlayer dielectric layer 5 to cover the exposed faces in the via hole 8 and the wiring recess 7 by a sputtering process, or the like. A Cu seed layer with a thickness of 5 to 20 nm is formed on the barrier layer 9 by a sputtering process and then, a thick Cu layer is formed on the Cu seed layer by a plating process. The resultant Cu layer 11 entirely fills the via hole 8 and the wiring recess 7. The unwanted parts of the Cu layer 11 and the barrier layer 9 deposited on the third interlayer dielectric layer 5 are removed by a CMP process, thereby forming a Cu plug 10 in the via hole 8 and a Cu wiring layer 11 in the wiring recess 7.

Instead of the plating process for forming the Cu layer 11, a sputtering or CVD process may be used.

A fourth interlayer dielectric layer 12, which is made of carbon-containing $SiO_2$, is formed on the third interlayer dielectric layer 5 to cover the wiring layer 11. The layer 12, which has a thickness of 20 to 400 nm, may be made of the same material as that of the second interlayer dielectric layer 3. The layer 12 serves as a diffusion prevention layer for preventing the Cu atoms existing in the wiring layer 11 from diffusing upward, and as an etch stop layer in a subsequent etching process (not explained here). The Cu diffusion prevention capability of the layer 12 becomes higher as its carbon content increases.

With the method of fabricating a semiconductor device according to the first embodiment, as described above, since the second interlayer dielectric layer 3 is made of carbon-containing $SiO_2$ having a lower etch rate than that of carbonless $SiO_2$, the layer 3 can be used as an etch slop layer in the dry etching process of the first interlayer dielectric layer 2 for forming the via hole 8 therein.

Moreover, because the carbon existing in the layer 3 is in the form of groups such as methyle, ethyle, or phenyle groups, the layer 3 has a relative dielectric constant lower than that of $SiN_x$. Therefore, the fringing field effect occurring in the wiring layer 11 and its adjoining wiring layer or layers can be reduced, which lowers the wire-to-wire capacitance in the semiconductor device.

Furthermore, carbon-containing $SiO_2$ has a property that the relative dielectric constant tends to decrease with its increasing carbon content and that the diffusion prevention capability of Cu is higher than that of carbonless $SiO_2$. Accordingly, by suitably setting the carbon content, the relative dielectric constant of the second and fourth interlayer dielectric layers 5 and 12, both of which are made of carbon-containing $SiO_2$, can be set as low as approximately 5 or less (i.e., $\epsilon \leq$ approximately 5). As a result, the wire-to-wire capacitance can be decreased and at the same time, the propagation delay of signals can be suppressed.

Due to existence of the fourth interlayer dielectric layer 12 made of carbon-containing $SiO_2$, the diffusion of Cu existing in the wiring layer 11 can be suppressed.

An additional dielectric layer made of carbon-containing $SiO_2$ may be formed on the third interlayer dielectric layer 5 prior to the process step of forming the patterned photoresist film 6, as shown in FIG. 2C. In this case, the film 6 is deposited on the additional carbon-containing $SiO_2$ layer. The thickness of the additional carbon-containing $SiO_2$ layer is, for example, 50 to 400 nm.

In the above-explained first embodiment, a single wiring layer is formed over the substrate 1, resulting in a two-level wiring structure. However, it is needless to say that at least one additional wiring layer may be formed over the wiring layer 11 in the same manner as that of the layer 11, forming a multilevel wiring structure.

Figure 2G:
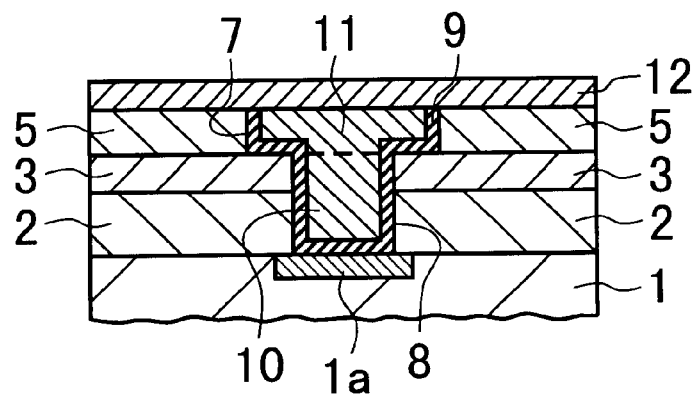

As seen from FIG. 2G, the semiconductor device according to the first embodiment has the dual damascene structure. In the device, the first and second interlayer dielectric layers 2 and 3 have the via hole 8 penetrating therethrough, and the via hole 8 exposes the surface of the substrate 1. The third interlayer dielectric layer 5 has the wiring recess 7 overlapping with the via hole 8, the recess 7 being formed to communicate with the via hole. The Cu plug 10 is formed in the via hole 8 to be contacted with the diffusion region 1a of the substrate 1. The Cu wiring layer 11 is formed in the recess 7. The fourth interlayer dielectric layer 12 is formed on the third interlayer dielectric layer 5 to cover the Cu wiring layer 11.

Each of the second and forth interlayer dielectric layers 3 and 5 is made of carbon-containing $SiO_2$ that is lower in relative dielectric constant than $SiN_x$. Therefore, the wire-to-wire capacitance is reduced compared with the case where a $SiN_x$ layer is used instead of carbon-containing $SiO_2$. Thus, the propagation delay of signals can be suppressed effectively.

Also, as seen from the above-explanation of the fabrication process sequence with reference to FIGS. 2A to 2G, the use of the carbon-containing $SiO_2$ layers does not make the fabrication process steps complicated. Therefore, the dual damascene structure can be fabricated without using any complicated processes and the fabrication cost increase can be prevented.

SECOND EMBODIMENT

FIGS. 3A to 3E show a method of fabricating a semiconductor device according to a second embodiment. This method also uses the dual damascene process.

Figure 3A:
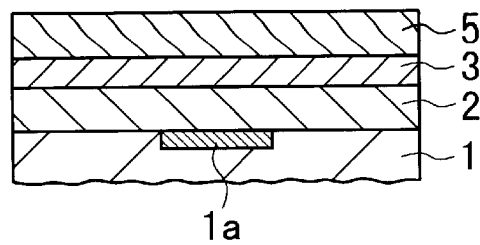
FIGS. 3A to 3E are partial, cross-sectional views of a semiconductor device showing the process steps of a method of fabricating the same according to a second embodiment of the present invention, respectively.

First, as shown in FIG. 3A, a single-crystal silicon substrate 1 having specific electronic elements such as transistors and at least one wiring layer is prepared. Only one diffusion region 1a is illustrated in FIG. 3A as one of the elements for the sake of simplification. Then, a first interlayer dielectric layer 2 with a thickness of 100 to 800 nm is formed on the surface of the substrate 1 by a plasma-enhanced CVD process. The layer 2 is made of plasma-deposited $SiO_2$, fluorinated plasma-deposited $SiO_2$ (i.e., SiOF), or HSQ.

Next, a second interlayer dielectric layer 3 with a thickness of 50 to 400 nm is formed on the first interlayer dielectric layer 2. The layer 3 is made of $SiO_2$ containing carbon of 5 to 30 wt. %. The layer 3 is formed by the same method as shown in the first embodiment.

The above process steps are the same as those in the first embodiment.

Figure 3B:
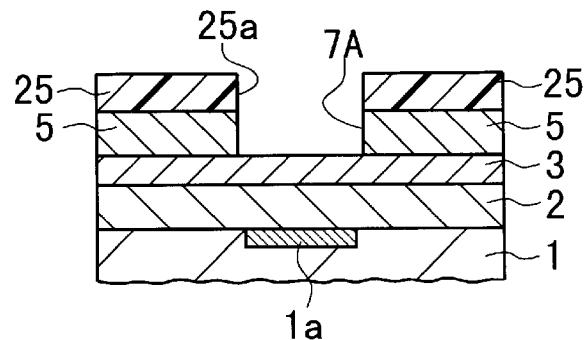

Next, as shown in FIG. 3B, a third interlayer dielectric layer 5 with a thickness of 200 to 800 nm is formed on the second interlayer dielectric layer 3. The layer 5 is made of $SiO_2$ containing no carbon. The state at this stage is shown in FIG. 3A.

A patterned photoresist film 25 is formed on the third interlayer dielectric layer 5. Although the film 25 has a pattern corresponding to a desired wiring recess, only one window 25a of the pattern of the film 25 is shown for simplicity. Using the patterned photoresist film 25 as a mask, the third interlayer dielectric layer 5 is selectively etched by a dry etching process using a suitable fluorine-containing gas as an etchant, thereby forming a wiring recess 7A in the layer 5. As the fluorine-containing gas, for example, $CF_4$, $C_4F_8$, or $C_2F_6$ may be used. The recess 7A overlaps with the diffusion region 1a of the substrate 1. The state at this stage is shown in FIG. 3B.

During the dry etching process, the underlying second interlayer dielectric layer 3 serves as an etch stop layer, because the layer 3 is made of carbon-containing $SiO_2$ that is lower in etch rate than ordinary carbonless $SiO_2$. Therefore, the underlying first interlayer dielectric layer 2 is not etched.

Figure 3C:
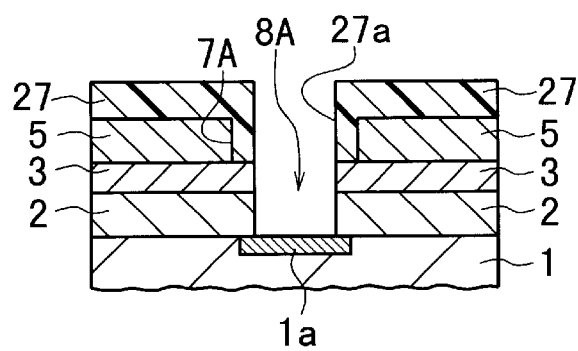

After the photoresist film 25 is removed, a photoresist film 27 is formed on the patterned third interlayer dielectric layer 5 over the whole substrate 1. The film 27 thus formed is patterned to have a desired pattern of a desired via hole. Here, only a window 27a of the patterned photoresist film 27 is shown in FIG. 3C. The window 27a is located just over the diffusion region 1a of the substrate 1.

Subsequently, using the patterned photoresist film 27 as a mask, the underlying second interlayer dielectric layer 3 made of carbon-containing $SiO_2$ is selectively etched by a dry etching process using a suitable fluorine-containing gas as an etchant. Following this, using the same photoresist film 27 as a mask, the underlying first interlayer dielectric layer 2 made of carbonless $SiO_2$ is selectively etched by a dry etching process using a suitable fluorine-containing gas as an etchant. Thus, as shown in FIG. 3C, a via hole 8A is formed to penetrate the second and first interlayer dielectric layers 3 and 2. The hole 8A overlaps with the overlying wiring recess 7A and communicates therewith. The hole 8A exposes the diffusion region 1a of the substrate 1.

Following the dry etching process, the photoresist film 27 is removed from the third interlayer dielectric layer 5 by using ionic oxygen plasma with strong anisotropy. Because of the use of ionic plasma, the photoresist film 27 can be removed without deterioration of the second interlayer dielectric layer 3 made of carbon-containing $SiO_2$.

Figure 3D:
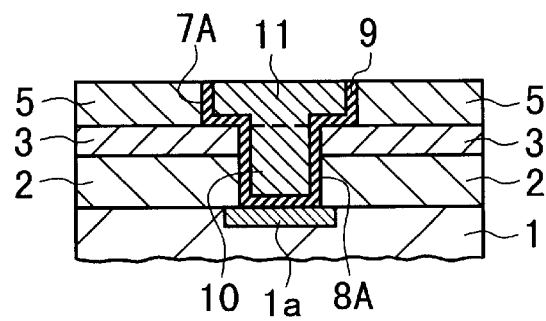

Throughout the above-described process steps, the dual damascene structure is completed, as shown in FIG. 3D. In this structure, the via hole 8A penetrating the first and second interlayer dielectric layer, 2 and 3 is located to overlap with the diffusion region 1a of the substrate 1 and at the same time, the wiring recess 7A penetrating the third interlayer dielectric layer 5 is located to overlap with the via hole 8A.

Thereafter, as shown in FIG. 3D, a metal barrier layer 9 with a thickness of 5 to 100 nm, which is made of TiN, Ta, or TaN, is formed on the third interlayer dielectric layer 5 to cover the exposed faces in the via hole 8A and the wiring recess 7A by a sputtering process. A Cu seed layer with a thickness of 5 to 20 nm is formed on the barrier layer 9 by a sputtering process and then, a thick CU layer is formed on the Cu seed layer by a plating process. The resultant Cu layer 11 entirely fills the via hole 8A and the wiring recess 7A. The unwanted parts of the Cu layer 11 and the barrier layer 9 deposited on the third interlayer dielectric layer 5 are removed by a CMP process, thereby forming a Cu plug 10 in the via hole 8A and a Cu wiring layer 11 in the wiring recess 7A.

Instead of the plating process for forming the Cu layer 11, a sputtering or CVD process may be used.

A fourth interlayer dielectric layer 12, which is made of carbon-containing $SiO_2$, is formed on the third interlayer dielectric layer 5 to cover the wiring layer 11. The layer 12, which has a thickness of 20 to 400 nm, may be made of the same material as that of the second interlayer dielectric layer 3. The layer 12 serves as a diffusion prevention layer for preventing the Cu atoms in the wiring layer 11 from diffusing upward and as an etch stop layer. The Cu diffusion prevention capability of the layer 12 becomes higher as it& carbon content increases.

With the method of fabrication a semiconductor device according to the second embodiment, since the second interlayer dielectric layer 3 is made of carbon-containing $SiO_2$ having a lower etch rate than that of carbonless $SiO_2$, the layer 3 can be used as an etch stop layer in the dry etching process of the third interlayer dielectric layer 5 to form the wiring recess 7A therein shown in FIG. 3A.

Moreover, because carbon existing in the layer 3 is in the form of groups such as methyle, ethyle, or phenyle groups, the layer 3 has a relative dielectric constant lower than that of $SiN_x$. Therefore, the fringing field effect occurring in the wiring layer 11 and its adjoining wiring layer or layers can be reduced, which lowers the wire-to-wire capacitance in the semiconductor device.

Furthermore, carbon-containing $SiO_2$ has a property that the relative dielectric constant tends to decrease with its increasing carbon content and that the diffusion prevention capability of Cu is higher than that of carbonless $SiO_2$. Accordingly, by suitably setting the carbon content, the relative dielectric constant of the second and fourth interlayer dielectric layers 5 and 12, both of which are made of carbon-containing $SiO_2$, can be set as low as 5 or less. As a result, the wire-to-wire capacitance can be decreased and at the same time, the propagation delay of signals can be suppressed.

Due to existence of the fourth interlayer dielectric layer 12 made of carbon-containing $SiO_2$, the diffusion of Cu existing in the wiring layer 11 can be suppressed.

An additional dielectric layer made of carbon-containing $SiO_2$ may be formed on the third interlayer dielectric layer 5 prior to the process step of forming the patterned photoresist film 25, a shown in FIG. 3B. In this case, the film 25 Is deposited on the additional carbon-containing $SiO_2$ layer. The thickness of the additional carbon-containing $SiO_2$ layer is, for example, 50 to 400 nm.

In the above-explained second embodiment, a single wiring layer is formed, resulting in a two-level wiring structure. However, it is needless to say that at least one additional wiring layer may be formed on the wiring layer 11 in the same manner as that of the layer 11, forming a multilevel wiring structure.

Figure 3E:
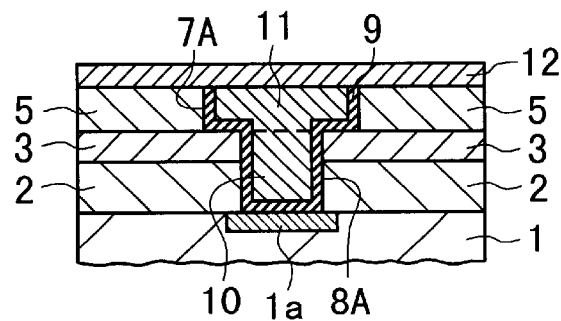

As seen from FIG. 3E, the semiconductor device according to the second embodiment has substantially the same dual damascene structure as that of the first embodiment. Therefore, the wire-to-wire capacitance is reduced compared with the case where a $SiN_x$ layer is used instead of carbon-containing $SiO_2$. Thus, the propagation delay of signals can be suppressed effectively.

Also, as seen from the above-explanation of the fabrication process sequence with reference to FIGS. 3A to 3E, the use of the carbon-containing $SiO_2$ layers does not make the fabrication process steps complicated. Therefore, the dual damascene structure can be fabricated without using any complicated processes and the fabrication cost increase can be prevented.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device equipped with the dual damascene structure, comprising the steps of:
   (a) preparing a semiconductor substrate having a lower wiring layer and electronic elements;
   (b) forming a first interlayer dielectric layer on said substrate;
   (c) forming a second interlayer dielectric layer on said first interlayer dielectric layer;
   said second interlayer dielectric layer being made of a carbon-containing $SiO_2$;
   (d) forming an opening in said second interlayer dielectric layer to overlap with said lower wiring layer or said electronic elements;
   (e) forming a third interlayer dielectric layer on said second interlayer dielectric layer having said opening;
   (f) forming a patterned mask layer having a window on said third interlayer dielectric layer;
   said window being located to overlap with said opening of said second interlayer dielectric layer;
   (g) patterning said third interlayer dielectric layer to form a wiring recess in said third interlayer dielectric layer using said patterned mask layer while said first interlayer dielectric layer is patterned to form a via hole in said first interlayer dielectric layer using said second interlayer dielectric layer;
   said via hole communicating with said wiring recess;
   (h) selectively forming a conductive layer to fill said wiring recess and said via hole after removing said patterned mask layer, thereby forming a wiring layer in said recess and a conductive plug in said hole;
   said wiring layer being contacted with said conductive plug; and
   (i) forming a fourth interlayer dielectric layer on said third interlayer dielectric layer to cover said wiring layer;
   said fourth interlayer dielectric layer being made of carbon-containing $SiO_2$.

2. The method according to claim 1, wherein acid carbon-containing $SiO_2$ contains a hydrocarbon group, and each of said second and fourth interlayer dielectric layers has a relative dielectric constant of 5 or lower.

3. The method according to claim 1, wherein said said carbon-containing $SiO_2$ contains a Si-H group.

4. The method according to claim 1, wherein each of said first and third interlayer dielectric layers is made of a substance elected from the group consisting of plasma-deposited $SiO_2$, fluorinated, plasma-deposited $SiO_2$ (SiOF), and hydrogen silsesquixan (HSQ).

5. A method of fabricating a semiconductor device equipped with the dual damascene structure, comprising the steps of:
   (a) preparing a semiconductor substrate having a lower wiring layer and electronic elements;
   (b) forming a first interlayer dielectric layer on said substrate;
   (c) forming a second interlayer dielectric layer on said first interlayer dielectric layer;
   said second interlayer dielectric layer being made of carbon-containing $SiO_2$;
   (d) forming a third interlayer dielectric layer on said second interlayer dielectric layer;
   (e) patterning said third interlayer dielectric layer to form a wiring recess therein to overlap with said lower wiring layer or said electronic elements;
   (f) forming a patterned mask layer having a window on said third interlayer dielectric layer;
   said window is located to overlap with said wiring recess of said third interlayer dielectric layer;
   (g) patterning said first and second interlayer dielectric layers to form a via holes penetrating said first and second interlayer dielectric layers using said patterned mask layer;
   said via hole communicating with said wiring recess;
   (h) selectively forming a conductive layer to fill said wiring recess and said via hole after removing said patterned mask layer, thereby forming a wiring layer in said recess and a conductive plug in said hole;

said wiring layer being contacted with said conductive plug; and (i) forming a fourth interlayer dielectric layer on said third interlayer dielectric layer to cover said wiring layer;

said fourth interlayer dielectric layer being made of carbon-containing $SiO_2$.

6. The method according to claim 5, wherein said carbon-containing $SiO_2$ contains a hydrocarbon group, and each of said second and fourth interlayer dielectric layers has a relative dielectric constant of 5 or lower.

7. The method according to claim 5, wherein said said carbon-containing $SiO_2$ contains a Si-H group.

8. The method according to claim 5, wherein each of said first and third interlayer dielectric layers is made of a substance selected from the group consisting of plasma-deposited $SiO_2$, fluorinated, plasma-deposited $SiO_2$ (SiOF), and hydrogen silsesquixan (HSQ).

* * * * *